United States Patent [19]

Esser et al.

[11] Patent Number: 4,468,684

[45] Date of Patent: Aug. 28, 1984

[54] HIGH-DENSITY CHARGE-COUPLED DEVICES WITH COMPLEMENTARY ADJACENT CHANNELS

[75] Inventors: Leonard J. M. Esser; Ludovicus G. M. Heldens, both of Eindhoven, Netherlands

[73] Assignee: U.S. Philips Corporation, New York, N.Y.

[21] Appl. No.: 365,709

[22] Filed: Apr. 5, 1982

[30] Foreign Application Priority Data

Apr. 16, 1981 [NL] Netherlands ............ 8101883

[51] Int. Cl.³ ............ H01L 29/78; H01L 27/14; H01L 31/00; G11C 19/28
[52] U.S. Cl. ............ 357/24; 377/61; 357/30
[58] Field of Search ............ 357/24 LR, 24 M, 30; 377/57–63; 307/311

[56] References Cited

U.S. PATENT DOCUMENTS 4,207,477  6/1980  Esser ............ 357/24 M
4,223,329  9/1980  Jambotkar ............ 357/24 M
4,229,754 10/1980  French ............ 357/24 M

FOREIGN PATENT DOCUMENTS 535604 11/1976 U.S.S.R. ............ 357/24 M

OTHER PUBLICATIONS

Chakravarti et al., "Mutiple Buried Channel Charge–Coupled Device" Solid–State Electronics, vol. 23, (7/80), pp. 747–753.
Barsan, "Characteristics of the Overlaid Charge–Coupled Device" IEEE Trans, Electron Devices, vol. ED–26, (2/79), pp. 123–134.

Primary Examiner—Gene M. Munson
Attorney, Agent, or Firm—Robert T. Mayer; Steven R. Biren

[57] ABSTRACT

A CCD includes several juxtaposed channels for hole transport and electron transport. Each channel forms a lateral boundary for an adjacent complementary channel so that high density in combination with a simple structure can be obtained. The CCD channels may include a matrix of photosensitive elements of a solid state image sensor for a camera. The invention may also be used in memory matrices and other CCD devices.

9 Claims, 24 Drawing Figures

HIGH-DENSITY CHARGE-COUPLED DEVICES WITH COMPLEMENTARY ADJACENT CHANNELS

BACKGROUND OF THE INVENTION

The invention relates to a charge-coupled device of the bulk-channel type having a semiconductor body comprising a surface-adjoining surface layer of the first conductivity type in which a number of mutually similar surface zones of the second conductivity type are provided which extend parallel to each other in the surface layer and, together with the intermediate, surface-adjoining parts of the surface layer, define a group of parallel and juxtaposed CCD-lines of alternately the first and the second conductivity type.

Such a device having complementary buried channels is known inter alia from U.S. Pat. No. 4,229,754. No indications are given in this patent as to how the signals can be read out and be drained. An obvious solution would be, as is shown in FIG. 1 of the present Application, to provide each channel with a conventional output. A disadvantage of this is that if the number of channels is large the number of contacts will also be large, which would involve a complex and space-consuming wiring. Moreover, as a result of the spreading in the value of the output capacitances, with equal charge packets, the channels would nevertheless give different output signals (fixed pattern noise).

SUMMARY OF THE INVENTION

It is the object of the invention to provide a charge-coupled device of the type described above having a simple and compact output configuration. Another object of the invention is to provide a charge-coupled device of the kind described above having an output configuration with which a good signal-to-noise ratio can be obtained.

According to the invention such a device is characterized in that the outputs of the said CCD-lines of the first and the second conductivity types, respectively, are connected to parallel inputs of a series register of the first conductivity type and to the parallel inputs of a series register of the second conductivity type, respectively, said series registers being also formed by CCD-lines of the bulk-channel type, the series register of the second conductivity type being defined by a further surface zone of the second conductivity type which is provided in the surface layer and which is present between the group of parallel CCD-lines and the series register of the first conductivity type which is defined by a part of the surface layer present beside the series register of the second type, means being present with which underpasses can be formed below the series register of the second conductivity type via which charge packets can be transferred from the group of parallel CCD-lines of the first conductivity type to the series register of the first conductivity type.

As a result of the formation of the underpasses, both the hole packets and the electron packets can be read out or drained via a common p-type series channel and a common n-type series channel, respectively. A separate output for each parallel channel individually is therefore no longer necessary so that a considerable space saving and, in the wiring, a considerable simplification can be obtained. Since in addition the group of p-channels and the group of n-channels each have a common output, an important improvement in the signal-to-noise ratio can be obtained.

BRIEF DESCRIPTION OF THE DRAWING

The invention will now be described in greater detail, by way of example, with reference to the accompanying diagrammatic drawing, in which:

FIG. 8 is a diagrammatic plan view of a charge-transfer device (CTD) sensor in accordance with the invention, of which

FIG. 14 is a diagrammatic plan view of an SPS-memory in accordance with the invention; and of which

DESCRIPTION OF THE PREFERRED EMBODIMENTS

Figure 1:
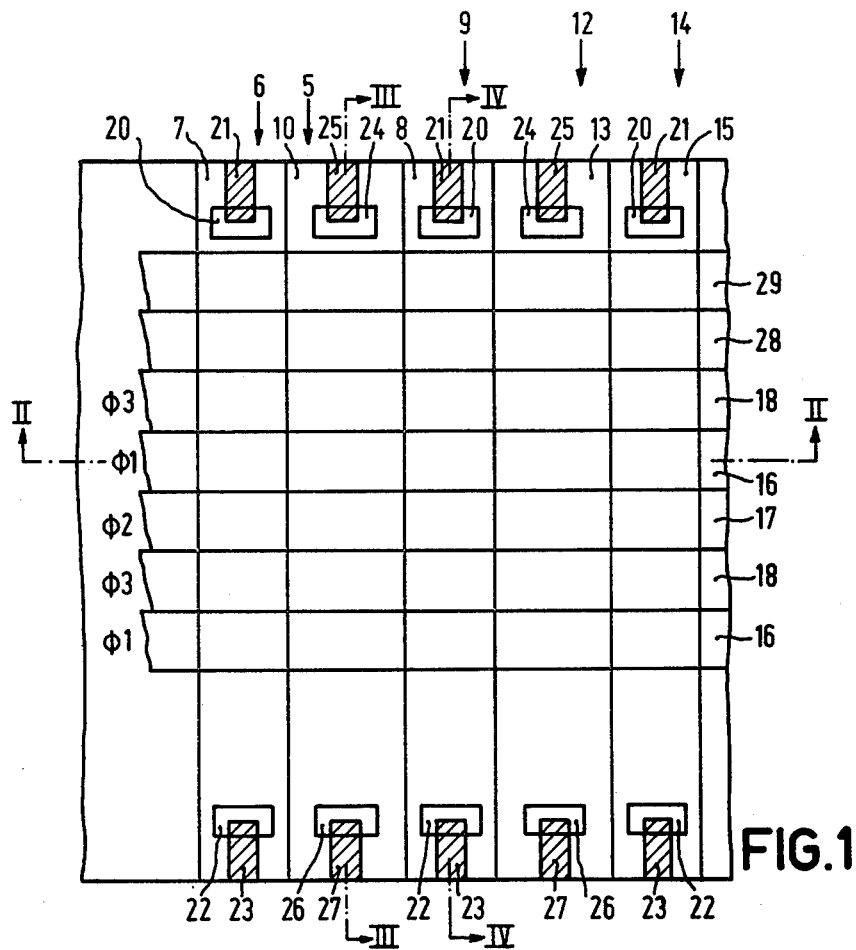
FIG. 1 is a diagrammatic plan view of a charge-coupled device comprising complementary channels and having conventional outputs.
Figure 2:
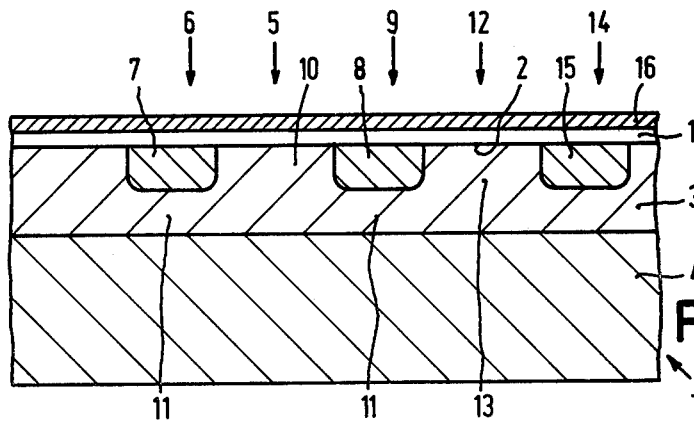
FIG. 2 is a sectional view of the device shown in FIG. 1 taken on the line II—II.
Figure 3:
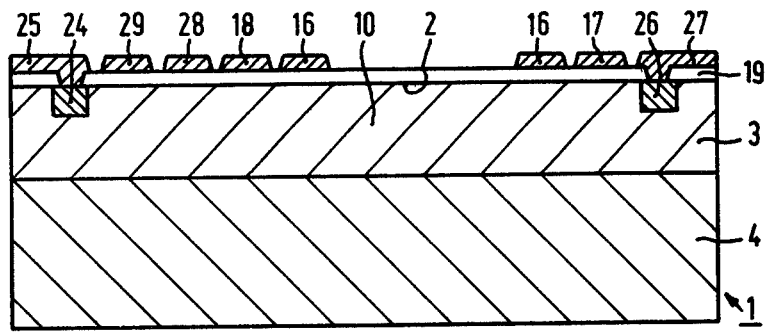
FIGS. 3 and 4 are sectional views taken on the lines III—III and IV—IV, respectively.
Figure 4:
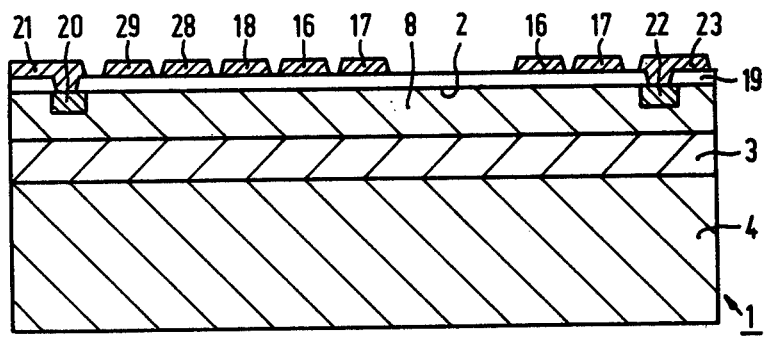

The device shown in FIGS. 1 to 4 comprises a semiconductor body 1 having a surface layer 3 of one conductivity type which adjoins the surface 2 and is supported on a substrate 4 of the other, opposite, conductivity type. In the embodiment described the surface layer 3 is of p-type silicon and the supporting member 4 is of n-type silicon, but it will be apparent that the conductivity types may also be reversed and that instead of silicon other semiconductor materials may also be used. Moreover, instead of a homogeneous substrate, the supporting member 4 may also be a substrate having an n-type partial layer which via a p-n junction changes into an underlying p-type layer.

The p-type surface layer 3 which can be obtained in the usual manner by means of ion implantation or by means of epitaxial deposition, for example, has a thickness of approximately $2.5/\mu m$ and a doping concentration of approximately $4.10^{15}/cm^3$. The doping concentration of the substrate 4 is approximately $5.10^{14}/cm^3$ and the thickness is approximately $300/\mu m$.

A first CCD-line 5 of the p-channel type and an adjoining second CCD line 6 of the n-channel type is defined in the p-type layer 3. The lines 5 and 6 are both of the bulk-channel type, i.e. of the type in which the charge transport takes place at least substantially in the interior of the semiconductor body 1.

For that purpose, the CCD line 6 with n-channel comprises an n-type surface zone 7 which is formed in the layer 3 and which extends from the surface 2 over only a part of the thickness of the p-layer 3. The thickness and the doping concentration are chosen to be so low that in the zone 7 a depletion zone can be formed throughout its thickness while avoiding breakdown, and they are, for example, approximately $0.6/\mu m$ and $2.10^{15}$ atoms/cm$^3$, respectively.

In accordance with the invention the n-type surface zone layer 3 comprises, besides the n-type surface zone 7, at least one second n-type surface zone 8 which is at least substantially identical to the zone 7 and defines a second n-channel bulk CCD line 9 parallel to the CCD line 6. The zones 7, 8 enclose an intermediately located part 10 of the p-type surface layer 3 which corresponds to the channel of the said p-channel CCD line 5. For this purpose the mutual distance between the n-type surface zones 7, 8 is chosen to be so large relative to the thickness of the semiconductor layer 3 and the depth of zones 7, 8 that, by applying voltages, potential minima for holes are formed in the part 10 of the layer 3 and potential barriers are formed in the parts 11 of the surface layer 3 below the n-type zones 7, 8.

In this particular embodiment in accordance with the invention the n-type channel CCD 6 and the p-type channel CCD 5 are not situated one on top of the other, but are situated beside each other so that the charge storage capacities in both channels are approximately equally large. Moreover, since the n-channel lines form a lateral boundary for the p-channel lines and the p-channel lines form a lateral boundary for the n-channel lines, the channels occupy comparatively little space so that a large number of lines can simply be provided in a common semiconductor body. For illustration, the Figures show, besides the already mentioned channels 5, 6, a further p-type channel CCD line 12 with the part 13 of the p-type surface layer 3 and the n-type channel CCD line 14 with the n-type surface zone 15, and it will be apparent that the structure can simply be further extended.

In order to obtain channels having approximately the same charge storage capacities, the channels have been made approximately equally wide, in the specific embodiment $15/\mu m$. The p-type regions 10, 13 may, if desired, be made slightly wider so as to compensate for differences, if any, in charge storage capacities caused inter alia by difference in doping concentration.

The device furthermore comprises the usual clock voltage electrodes 16, 17 and 18 which extend parallel to the surface 2 transversely to the charge transport direction. For reasons of simplicity these electrodes are shown in the Figures by conductor tracks which are situated immediately beside each other but it will be apparent that electrode configurations of paths mutually overlapping each other partly of, for example, polycrystalline silicon may also be used. The electrodes 16-18 are provided on an insulating layer 19 covering the surface 2, for example, an oxide layer having a thickness of approximately $0.07-0.1/\mu m$.

The electrodes 16-18 extend across the CCD lines, 5, 6, 9, 12 and 14. As shown inter alia in FIG. 2 the oxide layer 19, at least in a direction transverse to the direction of charge transport, has a substantially uniform thicknes in contrast with the described known device with complementary channels in which steps in oxide thickness are used as lateral channel boundaries.

The CCD lines 6, 9 and 14 of the n-channel type also comprise further an n+ type input zone 20 having an electrode 21, and an n+ type output zone 22 having an electrode 23. The p-type channel CCD lines 5 and 12 each comprise a p+ type input zone 24 connected to the electrode 25, and a p+ type output zone 26 connected to the output electrode 27. An input electrode 28 and a sampling electrode (sample gate) 29 are present between the input zones of the CCD lines and the clock electrodes 16-18.

During operation a voltage of, for example, 0 Volt is applied to the n-type substrate 4, a voltage of, for example, $-35$ V is applied to the p+ type output zone 26, and a voltage of approximately 0 Volt is applied to the n-type output zones 22.

Figure 5:
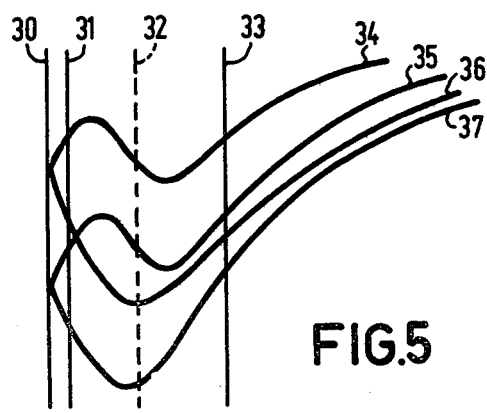
FIG. 5 shows potential profiles occurring during operation of the device shown in FIG. 1.

Clock voltages, for example, varying between $-10$ and $-20$ Volts, are applied to the clock electrodes 16-18. Starting from Poisson's equation, the potential in the semiconductor body can be calculated. FIG. 5 shows diagrammatically the potential variation in the semiconductor body as a function of the distance d to the surface. In this graph the distance in the semiconductor body to the surface 2 is plotted in the horizontal direction and the potential is plotted in the vertical direction. The line 30 indicates the surface of the oxide layer 19, the line 31 denotes the surface 2, the line 32 denotes the p-n junctions between the n-type surface zones 7, 8, 15 on the one hand and the p-type surface layer 3 on the other hand, and the line 33 denotes the p-n junctions between the p-type surface layer 3 and the n-type substrate 4. The curves 34 and 35 denote the potential profile at the area of the n-type channels at $-10$ and $-20$ Volts electrode voltage, respectively. A potential maximum (i.e. potential minimum for signal packets-forming electrons) is formed in the n-type surface zone 7, 8, 15 at some distance from the surface 2. In the underlying parts 11 of the p-type layer 3 potential minima are formed. The curves 36 and 37 indicate the potential profile at the area of the p-type channels 10, 13 at electrode voltages of $-10$ and $-20$ Volts, respectively. Potential minima in which charge packets consisting of holes can be stored are formed in the p-type layer 3 at some distance from the surface. Due to the choice of doping concentrations and dimensions, potential minima in the p-type regions 10, 13 are deeper than the potential minima in the p-type layer 8 below the n-type zones 7, 8, 15. As a result of this the channels of the p-type channel CCD lines 5, 12 are efficiently bounded without separate channel bounding means being required. The channels of the n-type channel CCD lines 6, 9 and 14 are bounded laterally by the reversely biassed p-n junctions between the n-type zones 7, 8, 15 and the p-type layer 3.

Figure 6:
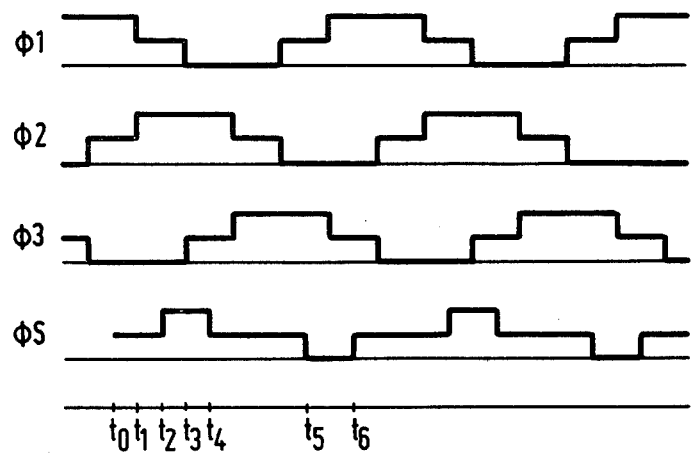
FIG. 6 shows clock voltages as a function of the time t for operating the device shown in FIG. 1.

The device may further be operated in the manner conventionally used for CCD's, for example, as a 3 or 4 phase device, but it will be apparent that the above-described principles may also be applied in constructions of 2 phases or 4 phases. FIG. 6 shows the clock-voltages $\phi_1$, $\phi_2$ and $\phi_3$ which can be applied to the electrodes 16, 17 and 18, respectively, as a function of time. The sampling voltage $\phi_5$ is applied to the electrode 29. A separate voltage may be applied to the clock electrode 28. In this case, however, the electrode 28 is simply considered to be connected to the electrodes 17 to which the clock voltage $\phi_2$ is applied. The voltages $\phi_1$, $\phi_2$, $\phi_3$ and $\phi_5$ vary between, for example, a maximum of $-10$ Volts and a minimum of, for example, $-20$ Volts. The central level is, for example, $-15$ Volts. It will be obvious that said central level may also be replaced by a gradually varying voltage. The input signals which are to be converted into charge packets are, for example, applied to the input diodes 20, 24.

Figures 7A, 7B:
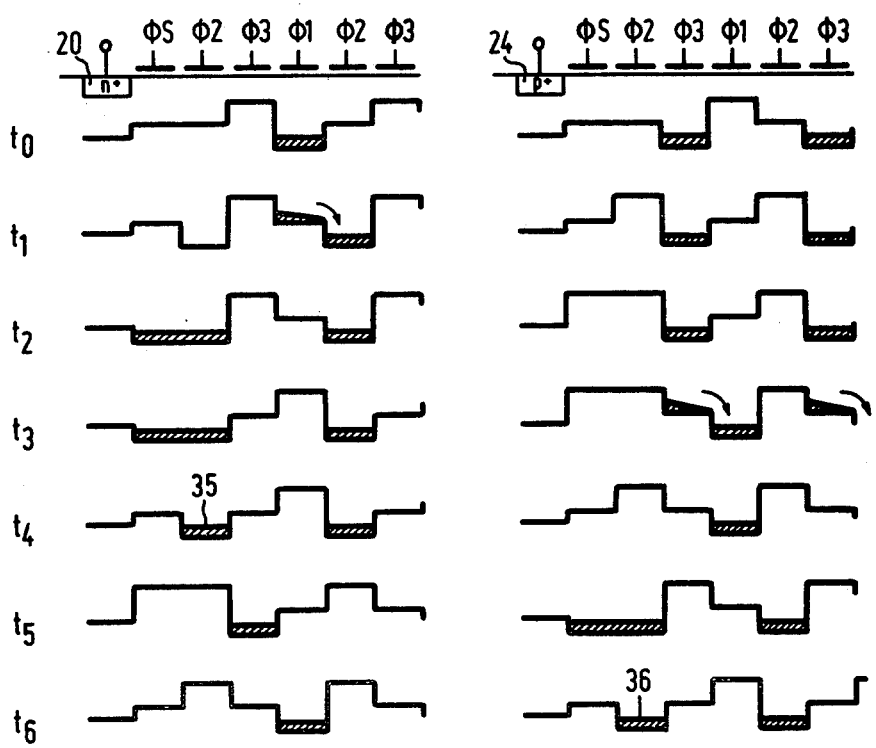
FIG. 7 shows potential profiles which occur in the semiconductor body at the applied voltages according to FIG. 6.

For explanation, FIG. 7a shows the potential diagram in the input part of an n-channel CCD line (positive potential downwards) at a number of instants shown in FIG. 6, and FIG. 7b shows the diagram in the input part in a p-channel CCD at the same instants (potential upwards): At t0 the electrodes 16 ($\phi_1$) are most positive and the electrodes 18 ($\phi_3$) are most negative. This means that below $\phi_1$ a potential pit for electrons is present in which charge (electrons) can be stored in an n-channel CCD, and below $\phi_3$ a potential pit for holes packets is present in the p-channel CCD. The n-type input zones of the n-channel CCD's and the p-type input zones of the p-channel CCD's and the p-type input zones of the p-channel CCD's are electrically separated from the (shaded) charge packets by intermediate potential barriers, as may be seen from FIGS. 7a and 7b respectively.

At t1, $\phi_2$ goes to $-15$ Volts, while $\phi_2$ increases to $-10$ Volts and $\phi_3$ and $\phi_5$ remain constant. In the n-channel registers, the packets of electrons are transferred to a next stage (see FIG. 7a). In the p-channel registers, however, no transport takes place at that instant, since the holes remain below the electrodes 18 ($\phi_3$) (FIG. 7b).

At t2, $\phi_5$ increases to $-10$ Volts so that the n-type input zones 20 may be connected electrically to potential pits formed below the electrodes 28 ($\phi_2$) in the n-channel registers (FIG. 7a). In the p-type channel registers the p-type input zones 24 remain electrically insulated.

At t3, $\phi_3$ increases to $-15$ Volts and $\phi_1$ decreases to $-20$ Volts. $\phi_2$ remains at $-10$ Volts. In the p-channel registers (see FIG. 7b) the packets of holes are transferred to the next stage. In the n-channel registers (FIG. 7a) the packets of electrons remain below the electrodes ($\phi_2$).

At t4, $\phi_5$ decreases to $-15$ Volts, so that the n-type input zones 20 in the n-channel registers are again separated from the potential pits below the input electrodes 28 so that below the electrodes 28 a fresh charge packet 35 is obtained, the size of which is a measure of the input signal which is applied to the associated input zone 20. This charge packet may be transported further in the same manner as described above.

At t5, $\phi_5$ again decreases from $-15$ Volts to $-20$ Volts so that the p-type input zones 24 in the p-channel registers can be connected to potential pits, below the electrodes 28 ($\phi_2$) in the p-channel registers (see FIG. 7b). At t6, $\phi_5$ again increases to $-15$ Volts so that in the p-type registers below the electrodes 28 packets 36 of holes are formed which form a measure of the input signals applied to the p-type zones 24. These packets of holes may then be further transported through the p-type registers in the manner previously described.

Although the charge capacity in the p-channel registers, with equal lateral dimensions of the channels, may be slightly smaller than in the n-channel registers due to the different distances between the potential minima and the electrodes, this difference is for many applications still reduced to an acceptable value as compared with the case in which the n and p-channel registers are situated above each other instead of beside each other. In addition, a further matching of charge storage capacities can be obtained in a simple manner, for example, by choosing the width of the p-channel registers to be slightly larger than the width of the n-channel registers. The charge storage capacity in the p-channel registers may also be increased by increasing the surface doping in the p-type channels, as already described in U.K. Patent Application No. 1470191, corresponding to U.S. Pat. No. 4,012,159, the contents of which are deemed to be incorporated in this application by reference. If desired, the n-type channels 7, 8 and 15 may also be provided with such a doping profile.

The device described can be manufactured in a simple manner by means of standard methods. The increase in density as compared with conventional charge coupled devices results from using the p-type channels also as a lateral boundary for the n-type channels, and vice versa, so that separate means which in the conventional charge coupled devices are necessary for the lateral boundary of the channels, are superfluous in a device in accordance with the invention.

The embodiment described here comprises a p-type surface layer in which n-type zones 7, 8 and 15 are provided by doping. In a number of cases, in particular when high requirements are imposed upon the speed at which the device can be operated, this configuration is to be preferred because possible reduction of the transport speed in the p-type channels as a result of the lower mobility of holes (with respect to electrons) can at least partly be compensated for by drift fields which may be larger in the comparatively thick p-type channels than in the comparatively shallow n-channel registers. However, in cases in which less high requirements are imposed upon operating speed, the conductivity types may of course be reversed advantageously.

Figure 8:
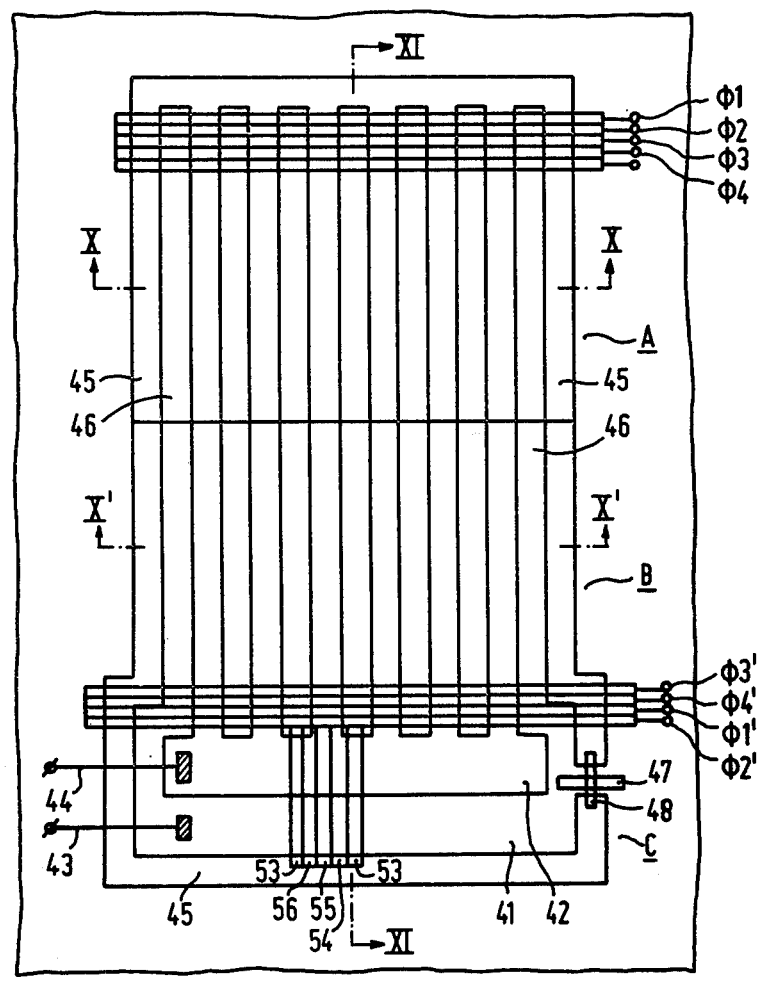
Figure 10:
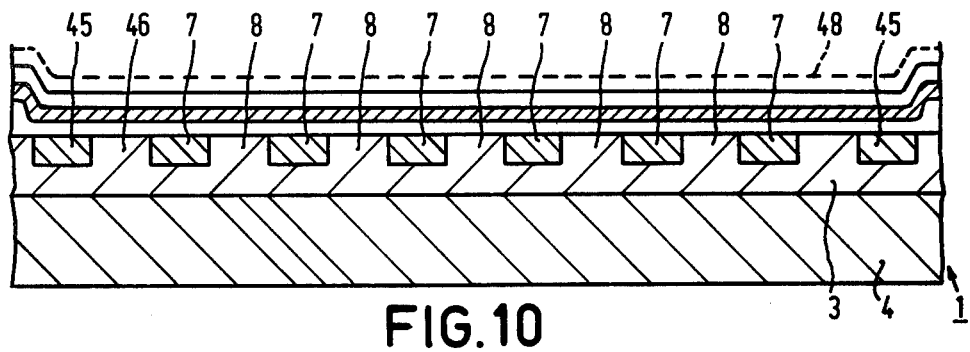

FIG. 8 is a diagrammatic plan view of an embodiment of a charge coupled device in accordance with the invention which relates to a sensor for a camera. FIG. 10 is a cross-sectional view taken on the line X—X in FIG. 8 and also a sectional view taken on the line X'—X' which cross-sectional views differ only in that the reflecting layer 48 which is shown in broken lines only belongs to the sectional view taken on the line X'—X' and does not occur in the upper part of FIG. 8. Otherwise, in this embodiment the same reference numerals are used for corresponding components as in the preceding embodiment.

The sensor comprises a semiconductor body 1, the composition of which may be identical to that of the semiconductor body 1 in the preceding embodiment having an n-type substrate 4 and a p-type surface layer 3 formed thereon. A number of n-type surface zones 7 which are separated from each other by strip-shaped intermediate parts 8 of the p-type surface layer 3 are formed in said surface layer. The n-type zones 7 again form the channels of the n-channel CCD's and the parts 8 form the channels of the p-type channel CCD's.

The lines 7, 8 are divided into two halves, the uppermost of which, denoted by A, forms the picture pickup sections and the lower part of which is denoted by B and forms the memory section. The channels 7 and 8 open into a series register which is denoted by C and which comprises a p-channel CCD with the p-type zone 41 and an n-channel CCD with the n-type zone 42. The channels (zones) 41, 42 as shown in FIG. 8, are transverse to the channels 7, 8 and comprise connections 43, 44 from which the video output signals may be derived and via which the p-type and the n-type channels can be biassed at a suitable voltage by means of voltage sources not shown in the figure.

The sensor is hence of the so-called frame transfer type in which the scene to be picked up is converted in the A section into a matrix of charge packets. This matrix is then transferred in a comparatively short period of time into the B register which is screened from incident radiation by a reflecting aluminum layer 40. The packets stored in the B section may then be transferred per line to the C registers and be read successively while simultaneously a fresh charge pattern is again generated in the A-section.

Along its circumference the sensor is bounded by an n-type ring 45 which is connected to the n-type channels 7 on the upper side of FIG. 8. The ring 45 on its upper side bounds the p-type channels 8 and on the lower side bounds the p-type channel 41. The p-type region 46 which is present between the ring 45 and the adjacent n-type channel 7 may be constructed as a part of the pick-up section A and memory section B. In the example shown, however, the region 46 is connected to the region beyond the ring 45 for draining charge in the region 46 via an aperture in the ring 45 by means of a connection 47. The aperture in the ring 45 may be bridged by means of a conductive connection 48 which is insulated electrically from the connection 47. If desired, the ring 45 may be applied to a suitable potential, for example, on its upper side via one or several contacts not shown.

It is to be noted that only one pair of CCD lines 7, 8 are shown in the drawings, but this number may actually be much larger and may even be many hundreds.

Figure 9:
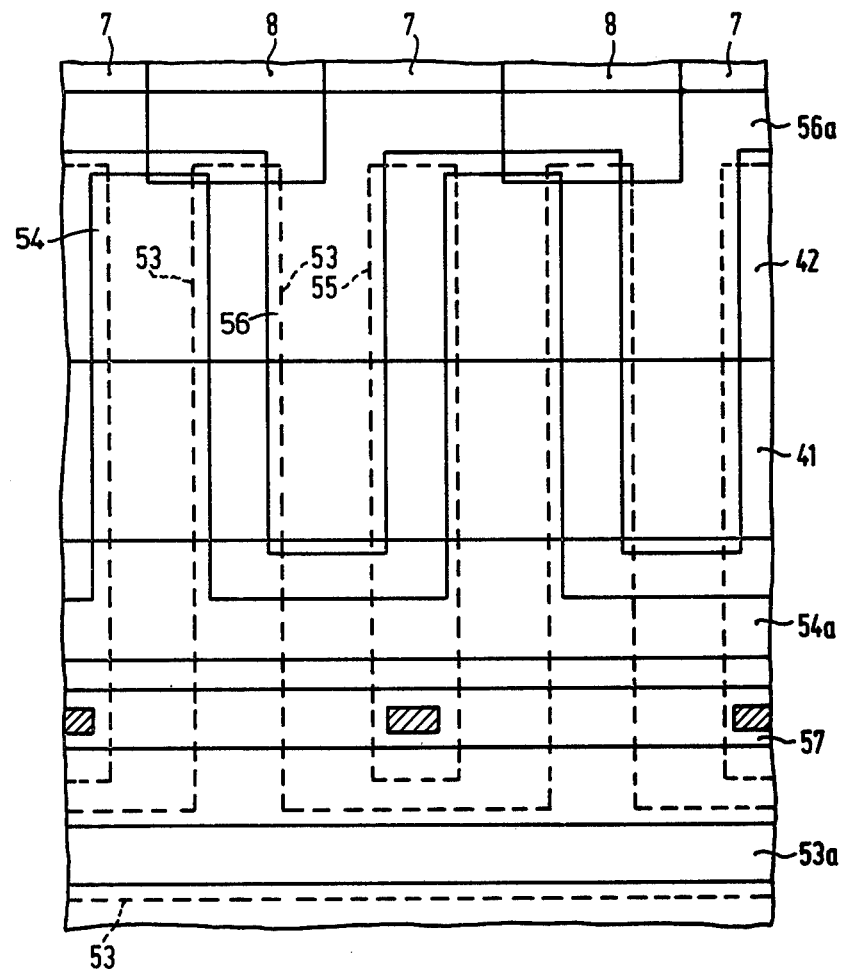
FIG. 9 shows a part on an enlarged scale and FIGS. 10 and 11 are sectional views taken on the lines X—X and XI—XI, respectively, in FIG. 8.
Figure 11:
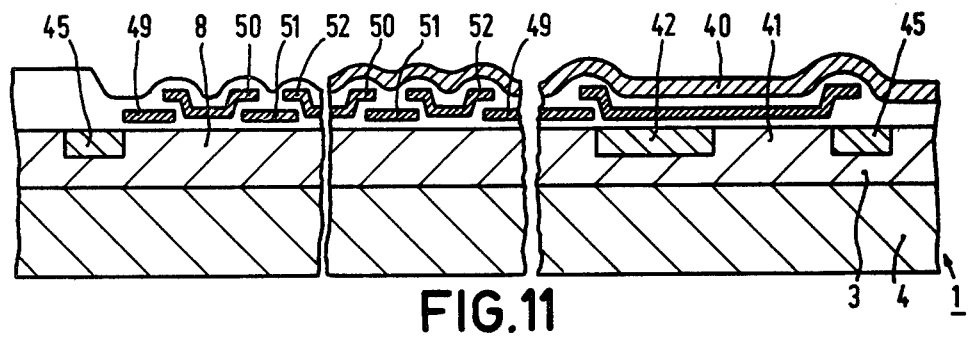

The A, B and C sections each comprise an individual set of clock electrodes $\phi_1 \ldots \phi_4$, that is to say that in this embodiment the CCD lines are operated with 4 phases clock electrodes. The p and n-channels in the A section and the B section, as in the preceding example, have common electrodes in the form of two layer polycrystalline overlapping silicon tracks 49–52 as shown in FIG. 11. If desired, the Al coating 40 may extend above the n-type zone 45 and the p-type region 46 in the A-section. For illustration of the parallel-series junction, FIG. 9 shows on an enlarged scale a part of the C-register (approximately 2 cells large).

The electrodes 53 and 55 are in the form of a first layer of polycrystalline silicon. The strips 53 form part of a comb structure which may be contacted to an Al-strip 53a. The electrodes 55 are formed by digits manufactured in the same poly layer as the electrodes 53 and may be interconnected and connected to a voltage source by means of an Al track 57. The electrodes 54 and 56 are in the form of a second polycrystalline silicon layer or Al-layer (electrically insulated from the first poly-layer which is shown in broken lines in FIG. 9). The electrodes 56 and 54 constitute two interdigitating comb configurations, the digits 54 of which are connected together by the strip 54a and the digits 56 are connected together by the strip 56a. The base of the comb configuration with the electrodes 56 may be present above the last clock electrode of the memory section B by means of which the signals can be shifted from the base section into the C-register. This clock electrode which may be in the form of the first or a further underlying polysilicon layer is not shown in FIG. 9 to avoid undue complexity in the drawing.

Figure 12:
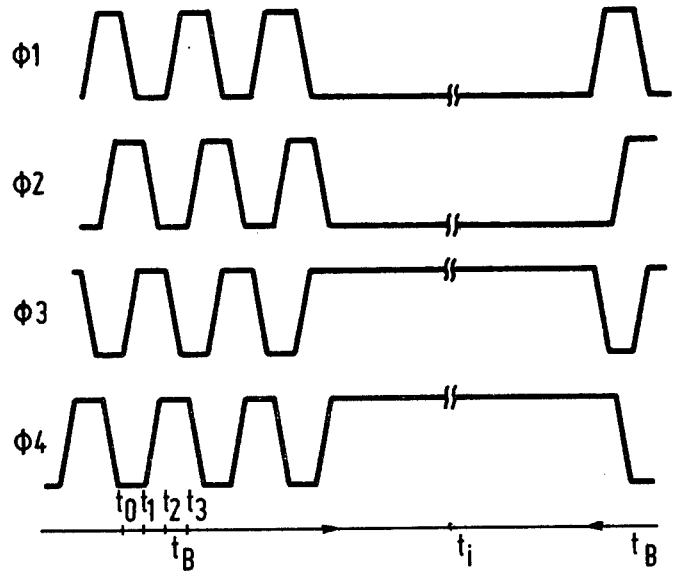
FIGS. 12 and 13 are diagrams of the clock voltages which are applied to the device shown in FIG. 8.
Figure 13:
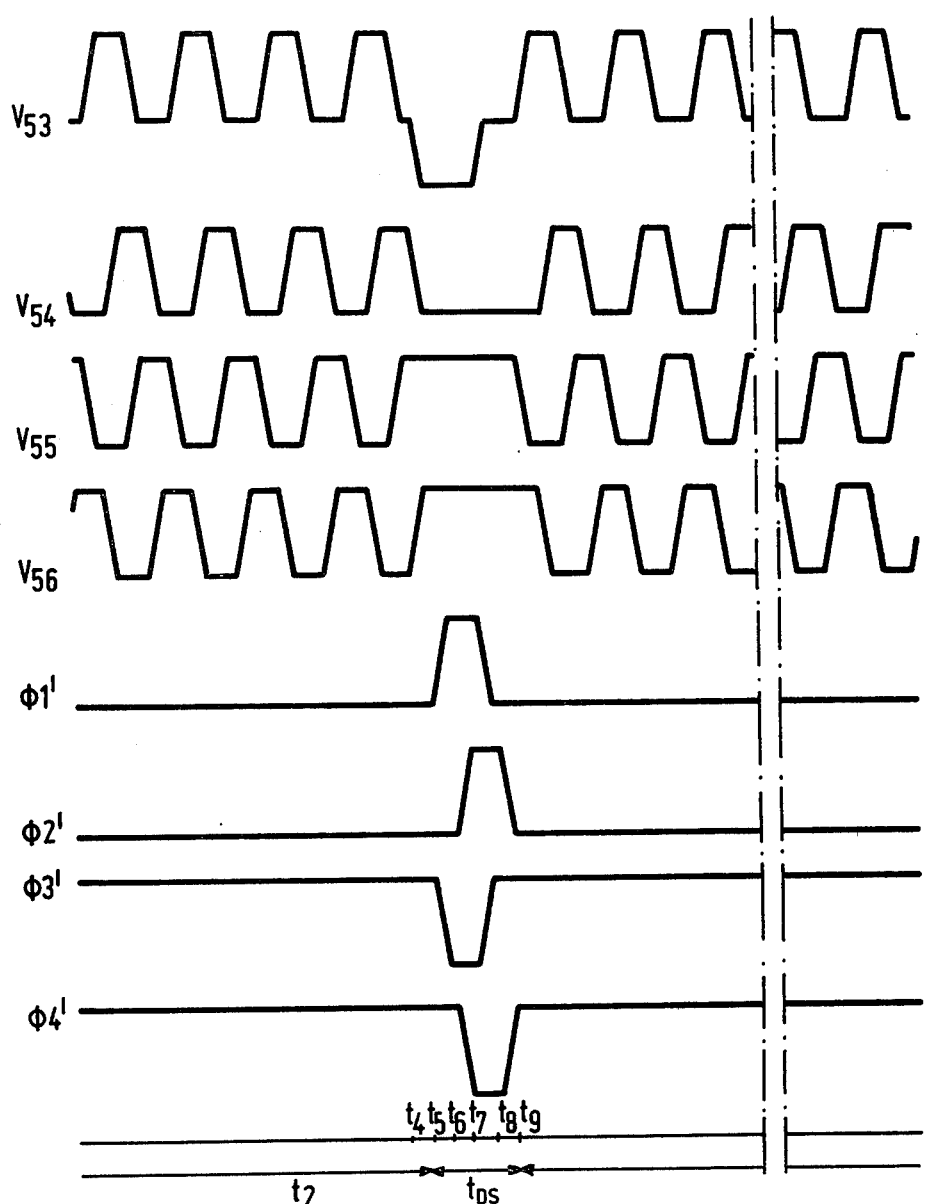

In order to illustrate the operation of the device, FIGS. 12 and 13 show the clock voltages as a function of time which are applied to the electrodes during operation. FIG. 13 shows the clock voltages which are applied in the pick-up section A, in which $t_B$ denotes the period in which a generated charge pattern is shifted from the A-section into the B-section and $t_i$ is the integration period in which a received picture is converted into a charge pattern. In the interval $t_B$ the same clock voltages $\phi_1$, $\phi_2$, $\phi_3$ and $\phi_4$ may be applied to the memory section B as to the pick up section A; in the interval $t_i$ voltages $\phi_1'$, $\phi_2'$, $\phi_3'$ and $\phi_4'$ shown in FIG. 13 are applied to the memory section.

Both the pick-up section A, the memory section B and the series registers C are operated as 4-phase systems. In contrast with the preceding embodiment the clock voltages show only 2 levels of, for example, −10 and −20 Volts, with the exception of the voltage V53 which has three levels which will be further explained hereinafter. In principle, the same voltages may be applied to the n-and p-regions and to the substrate as to corresponding regions in the preceding embodiment.

For the operational description it is presumed for convenience sake that in the pick-up section A a charge pattern is stored which is transported in the B-section. This transport takes place as follows:

At t0 (FIG. 12) the electrodes to which the voltages $\phi_1$ and $\phi_2$ are applied, hereinafter referred to as $\phi_1$ and $\phi_2$ electrodes, respectively, are at −10 Volts and the $\phi_3$ and $\phi_4$ electrodes are at −20 Volts. Below the $\phi_1$ and $\phi_2$ electrodes electrons are present, and holes are present below the $\phi_3$ and $\phi_4$ electrodes. At t1, $\phi_2$ and $\phi_4$ remain at −10 and −20 Volts, respectively, while $\phi_1$ and $\phi_3$ are brought to −20 and −10 Volts, respectively. The electrons then distribute below the $\phi_2$ and $\phi_3$ electrodes while the holes distribute below the $\phi_4$ and $\phi_1$ electrodes. Between t1 and t2, the $\phi_1$ electrodes and the $\phi_3$ electrodes remain at −20 and −10 Volts, respectively, while the $\phi_2$ and $\phi_4$ electrodes now move to −20 and −10 Volts, respectively. The holes then move below the $\phi_1$ and $\phi_2$ electrodes, while the electrons are stored below the $\phi_3$ and $\phi_4$ electrodes.

In this manner the whole charge pattern of holes and electrons can be moved from the A-section into the B-section. When at the end of $t_B$ the transport is completed and the whole A-section is empty, the interval $t_i$ begins and a picture can again be converted into a charge pattern of holes and electrons. For this purpose, by way of example, a voltage of −20 Volts is applied to the $\phi_1$ and the $\phi_2$ electrodes and a voltage of −10 Volts is applied to the $\phi_3$ and the $\phi_4$ electrodes. As a results of this, electrons generated in the n-channel CCD's are stored below the $\phi_1$ and $\phi_2$ electrodes. In the p-channel CCD, generated holes are stored below the $\phi_3$ and $\phi_4$ electrodes.

During pick up of the scene, the information stored in the memory section can be read via the series registers C. FIG. 13 shows the diagram of clock voltages which are applied in $t_i$ to the clock electrodes of the memory section B ($\phi_1'$, $\phi_2'$, $\phi_3'$, $\phi_4'$) and the voltages which are applied to the clock electrodes 53-56, respectively, of the series register C. The indication $t_r$ denotes the time interval in which a line which is moved in the series registers is read. The charge transport in the C-registers takes place from the right to the left in the same manner with 4-phase clock voltages as the charge transport from the A-section to the B-section. When a line has been read, a new line is moved into the C-registers from the memory section, the other lines in the B-register simultaneously moving one place. This occurs in the time interval which is denoted by $t_{ps}$ (parallelseries) in FIG. 13.

At $t_4$ the $\phi_3'$ and the $\phi_4'$ electrodes are at $-10$ Volts, the $\phi_1'$ and the $\phi_2'$ electrodes are at $-20$ Volts. So holes are stored below the $\phi_1'$ and $\phi_2'$ electrodes and electrons are present below the $\phi_3'$ and $\phi_4'$ electrodes. The electrodes 53 and 56 in the series register are simultaneoulsy at $-20$ Volts while the electrodes 54, 55 are at $-10$ Volts. Transport of electrons from the $\phi_3'$ and $\phi_4'$ electrodes to the series register 42 is prevented by the lower voltage at the $\phi_1'$ and $\phi_2'$ electrodes. Transport of holes to the p-type register is prevented by the potential barrier in the p-type layer 3 below the n-type register 42. For transferring holes, an extra negative voltage, for example of $-35$ Volts, is applied to the electrodes 53 at $t_5$. As a result of this the potential barrier in the p-type layer 3 below the n-type register 42 is reduced so that the holes which are stored below the $\phi_1'$, $\phi_2'$ electrodes, can flow into the p-type register 41 of the C-section via the region below the n-type register 42 and can distribute there after transport below the electrodes 53 and 54, which then are also at $-20$ Volts.

At $t_5$ the electrodes 56 are at $-10$ Volts and thereby form a barrier to limit the holes packets in the register 41. At $t_5$ and $t_7$, $\phi_1'$ and $\phi_2'$ have successively risen to $-10$ Volts. The holes present below the last $\phi_1'$ and $\phi_2'$ electrodes are now transported entirely to the series register while simultaneously all holes packets in the memory section B are moved in the direction of the series register. At the same time, $\phi_3'$ and $\phi_4'$, respectively, move to $-20$ Volts between $t_6$ and $t_7$, respectively, so that the electrons are moved to the $\phi_1'$ and $\phi_2'$ electrodes. At $t_8$ and $t_9$, $\phi_1'$ and $\phi_2'$ again move to $-20$ Volts. The electrons present below the last $\phi_1'$ and $\phi_2'$ electrodes are then shifted in the C-register 42 below the electrodes 55, 56 which are at $-10$ Volts. At the same time the electrodes 53 again are at $-20$ Volts. An entire line of holes and electron packets is now shifted in the C-register and may then be further transported in the C-section, in the manner already described, to the output terminals 43, 44 where the output signals can be read.

In the embodiment described, the parallel-series transport of the holes is produced by applying an extra negative voltage of $-15$ Volts to the electrodes 53. If desired, this extra voltage may be reduced by increasing the doping concentration in the p-type region below the n-type zone 42. Because such an extra doping will also influence the potential distribution in the n-type channels 42, in the sense that the potential wells of the electrons to be transported will become less steep, the doping concentration of n-type impurities can advantageously be increased in a shallow surface zone of the n-type channels 42. In this manner, during the transport of electrons through the channels 42 a part of the electrons may be prevented from flowing back to the memory section B.

Further advantages of an extra doping in a comparatively thin surface layer of the transport channels which can also be provided in the channels of the A-section and the B-section and, besides in the n-channels, also in the p-type channels are described in U.K. Patent Application No. 1,470,191 corresponding to U.S. Pat. No. 4,012,759, the contents of which have been incorporated in this Application by reference.

In order to prevent spreading of charge carriers as a result of local overexposure (blooming), known methods may be used as in conventional devices. For example, each p and n-channel may have on one of its long sides a $p^+$ and $n^+$ drain zone, respectively, which is separated laterally from the associated channel by an overflow barrier. As regards dimensions and doping concentrations, the device may also be manufacuted so that at certain voltages to be applied, upon overexposure, one type of excessive charge carriers spread in vertical direction, that is to say in the channel direction, and excessive charge carriers of the other type spread in a direction transverse to the channel direction, so that upon displaying the pick-up scene an overexposed point is displayed in the form of a star. This is much less annoying than a vertical stripe over the displayed picture which is formed as a result of overexposure in the absence of so-called anti-blooming means.

Figure 14:
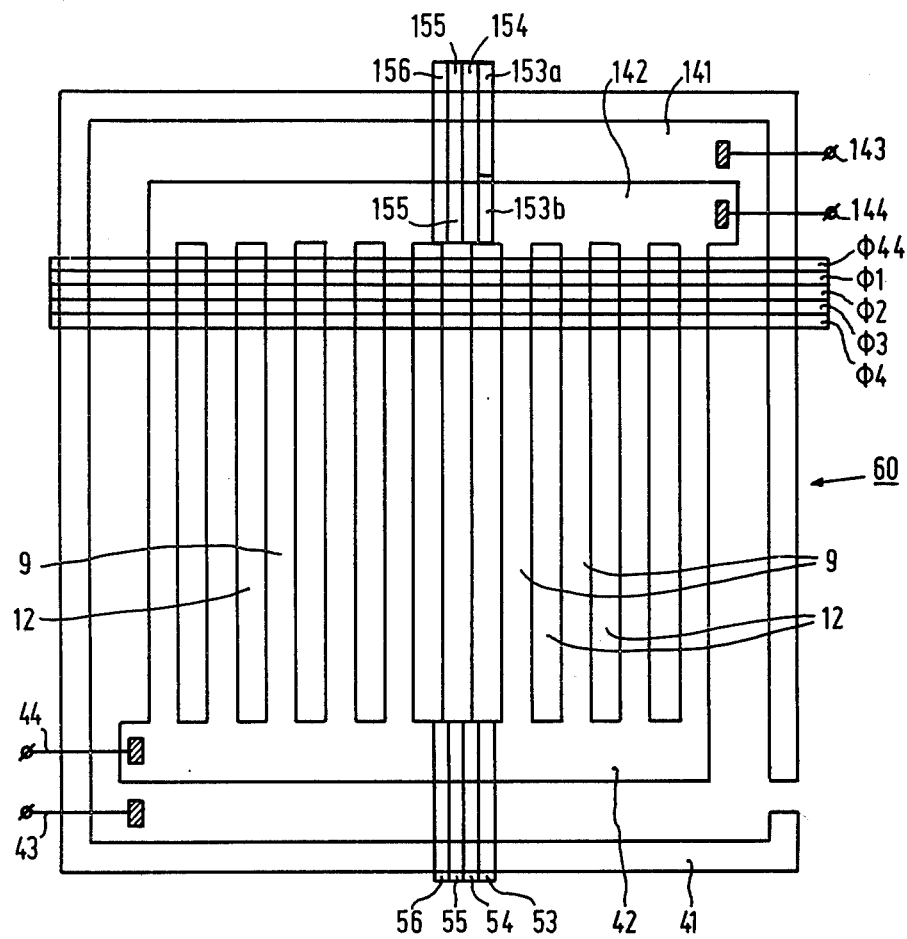

FIG. 14 is a diagrammatic plan view of a CCD memory device of the SPS type in accordance with the invention.

The most important part of the device is formed by the memory section 60 in which the charge packets are shifted in parallel from the top to the bottom along a number of parallel CCD lines. These lines comprise a number of parallel n-channel CCD lines 9 alternated and bounded by intermediate p-channel CCD lines 12. The n-lines 9 form the parallel inputs of an n-channel CCD output register 42 and the p-lines 12 form the parallel inputs of the p-type CCD output register 41. The registers 9, 12, 41 and 42 correspond to the parallel sections A, B and the output registers 41, 42 in the preceding embodiment, respectively, and are also operated with a four-phase clock system.

The device furthermore comprises a p-type input register 141 and an n-type input register 142 having inputs 143 and 144, respectively, for supplying the memory information.

When an underlying oxide layer of a suitable thickness is used, the input electrode 144 may be used, if desired, as a gate electrode of a switch with which charge can be prevented from flowing from the input of the p-type input register 141 to the p-type ring around the parallel section. The information is transported in the registers 141, 142 by means of a 4-phase clock system which comprises the clock electrodes 153-156. In behalf of the series-parallel transport, of these electrodes at least the electrodes 153 are divided into two parts, namely the part 153$a$ which is associated with the p-type register 141 and the part 153$b$ which forms part of the n-type register 142.

Figure 15:
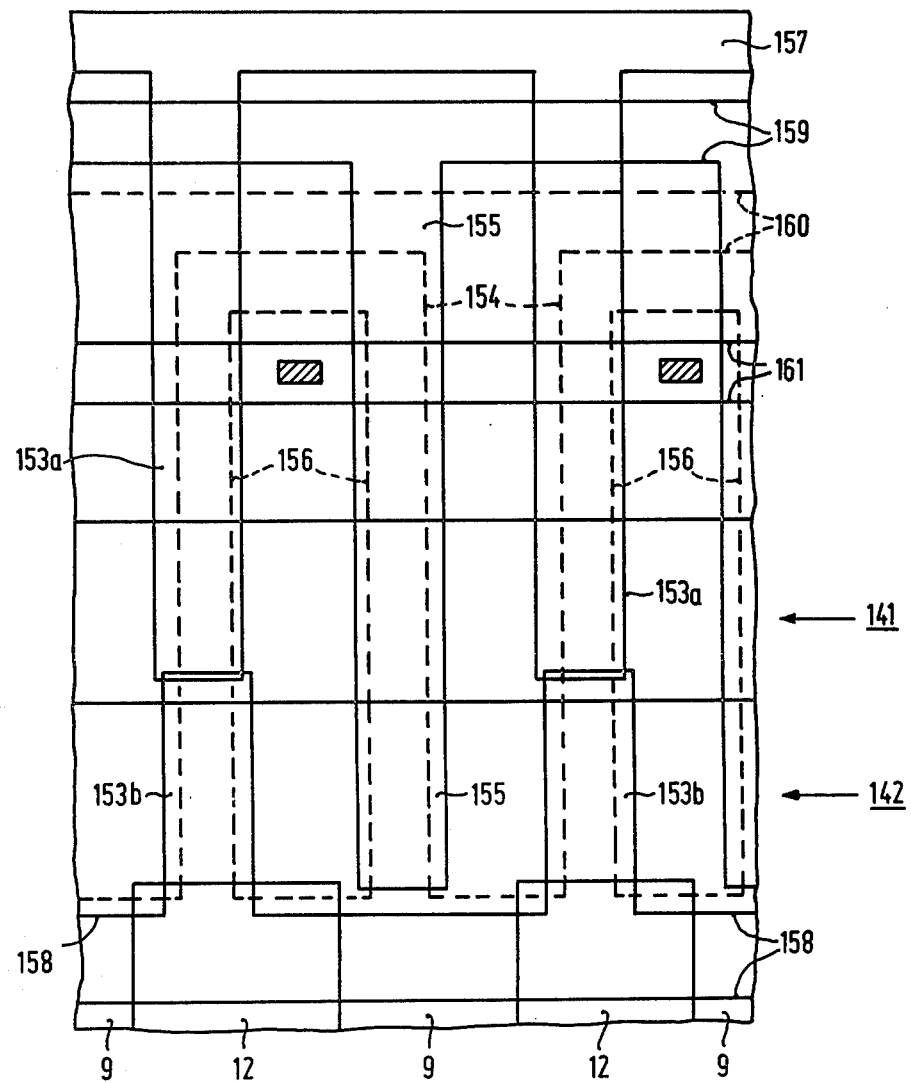
FIG. 15 shows a part of the SP junction on an enlarged scale.

FIG. 15 is a diagrammatic plan view on a slightly enlarged scale of a part of the series registers 141, 142. On the lower side of this figure several n and p-type parallel registers 9, 12 are shown. The first clock electrode $\phi_{44}$, shown in this embodiment by way of example as a separate electrode $\phi_{44}$ above the parallel inputs between the registers 144, 142 on the one hand and the registers 9, 12 on the other hand, is not shown for clarity. The electrodes 153a, mutually interconnected by the strip 157, are constructed, for example, in a first polycrystalline silicon layer. In a second polylayer electrodes 153b which overlap the electrodes 153a and are mutually interconnected by the strip 158, may be provided together with the electrodes 155 which are interconnected by the strip 159. In a third polylayer shown in broken lines, the electrodes 154 interconnected by the strip 160 and the electrodes 156 may be formed. The electrodes 156 are provided in the form of separate digits which are connected to a common strip 161 of, for example, A1. The contacts between the A1 and the polysilicon are shown shaded in FIG. 15.

Figure 16:
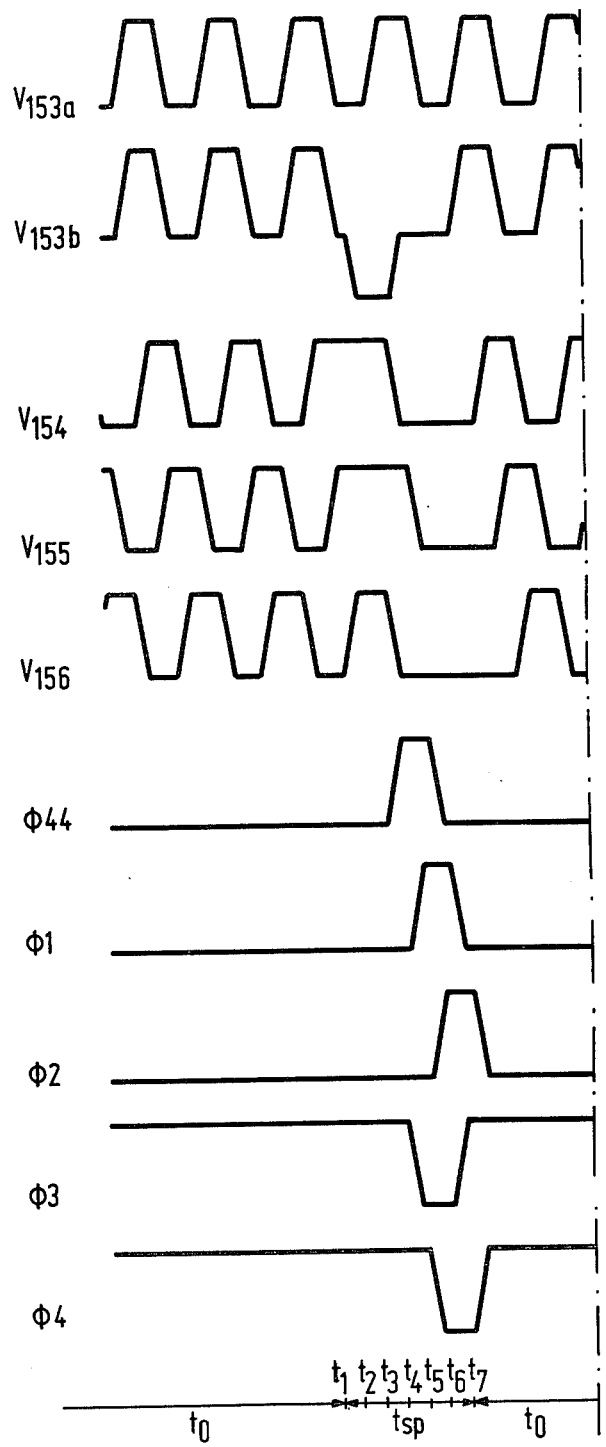
FIG. 16 shows a diagram of the clock voltages to be applied to said memory.

For explanation of the operation of the device, reference is made to FIG. 16, which shows the diagram of the clock voltages which are applied to the electrodes 153–156 and to the clock electrodes $\phi_1$–$\phi_4$ and $\phi_{44}$. In the intervals denoted by $t_0$, holes and electron packets are shifted in the p and n-registers 141 and 142, respectively, by means of 4-phase clock voltages, in the same manner as described with reference to the preceding embodiment. The series-parallel transport takes place in the interval $t_{sp}$.

At $t_1$ the holes are present below the electrodes 153a, 156 (both −20 Volts) and the electrons are present below the electrodes 154, 155 (both −10 Volts). It is assumed that no charge is present below the first electrode ($\phi_{44}$) of the parallel section. The transport of holes from the electrode 153a to said $\phi_{44}$ electrode (−20 Volts) is prevented by the barrier below the n-type series register 142.

Therefore, V153b drops to −35 Volts between $t_1$ and $t_2$ so that said barrier disappears. At the same time V156 increases to −10 Volts and holes can flow to $\phi_{44}$ below the series register 142. Between $t_2$–$t_3$, V153a increases to −10 Volts, while $\phi_{44}$ remains at −20 and V153b remains at −35 Volts, so that holes can be transferred to $\phi_{44}$. Between $t_3$–$t_4$, V153b again increases to −20 Volts and $\phi_{44}$ to −10 Volts. In this situation all holes packets are present below the $\phi_1$ and $\phi_2$ electrodes, which are also at −20 Volts. Between $t_4$–$t_5$, $\phi_1$ increases to −10 Volts while $\phi_3$ decreases to −20 Volts, so that the holes packets below the $\phi_2$ and $\phi_3$ electrodes are transferred.

Up to the instant $t_3$, the electrons remain in the series register below the electrodes 154, 155 and 156. The packets are separated from each other by the low voltage at the electrodes 153b. Between $t_3$–$t_4$, $\phi_{44}$ passes to −10 Volts while V154 and V156 decrease to −20 Volts. The electrons now distribute below the electrodes 155 and $\phi_{44}$. Between $t_4$–$t_5$, V155 also decreases to −20 Volts, while $\phi_1$ increases to −10 Volts, so that all electron packets are stored below the $\phi_{44}$ and the adjacent $\phi_1$ electrode. Between $t_5$–$t_6$, $\phi_{44}$ again decreases to −20 Volts, while $\phi_2$ increases to −10 Volts, so that the electron packets move in the parallel section over a distance of one electrode.

The holes and electron packets may then be further transported down in the parallel section with a favorably chosen frequency and be shifted there line by line, in the same manner as in the preceding embodiment, in the series output registers 41, 42, and via said registers to the output terminals 43, 44.

Immediately after the series-parallel transport, the input series registers 141, 142 can again be filled with a new line of information which can be transferred again to the parallel section in the manner described.

The embodiments described so far related mainly to 3 or 4-phase CCD's, but it will be apparent that all known methods to obtain 2-phase or even 1-phase devices may also be used in combination with the principles of the present invention. For example, an asymmetry in the potential distribution necessary for 2-phase operation can be obtained by means of impurity ion implantation below the clock electrodes. In this connection it should be taken into account that impurity of a given type, for example of the n-type, causes a potential well in the n-channel registers and causes a potential barrier in the p-channel registers. The result of this is that, when it is assumed that, with respect to the transport direction, the implantation in the n and p-channels is carried out on the same side of the electrodes, the charge transport in the p-type channel registers will be opposite to that in the n-type channel registers.

By using various implantations for the n and p-channels and/or by carrying out the implantation on different sides of the electrodes, 2-phase CCD devices in accordance with the invention can be obtained with charge transport in the same direction.

Figure 17:
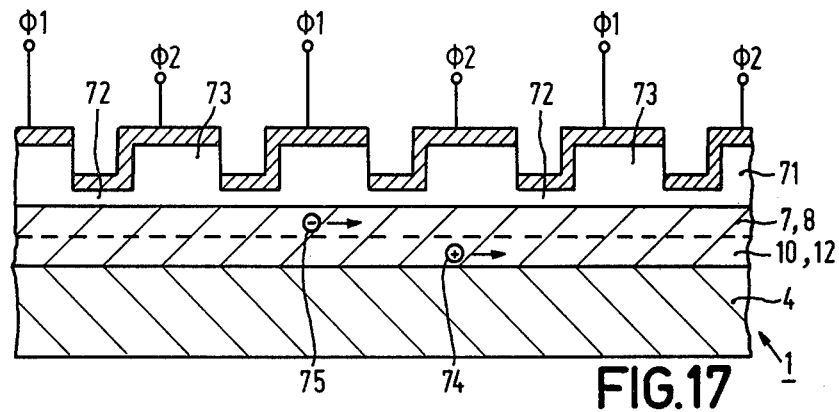
FIG. 17 is a sectional view of a 2-phase CCD in accordance with the invention.
Figure 18:
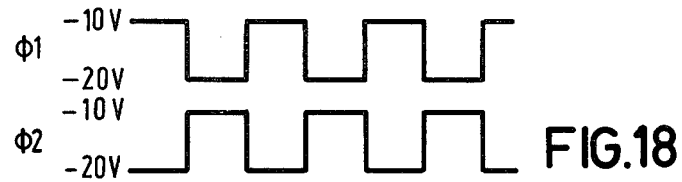
FIG. 18 shows a diagram of the clock voltages to be applied to the CCD of FIG. 17.

FIG. 17 shows an embodiment of a 2-phase CCD device in accordance with the invention in which the charge transport in the n and p-channels takes place in the same direction. This Figure is a cross-sectional view of a part of a device in the charge transport direction, the broken line denoting the depth of the n-channels. The surface of the body 1 is covered with a strip-shaped oxide layer 71 comprising thin portions 72 and thicker portions 73. The clock electrodes are provided so that each electrode is present both on a thin portion and on a thick portion. As a result of this, both for the holes 74 and for the electrons 75, potential minima are formed below the thick oxide portions 73 and potential barriers are formed below the oxide layers 72 below the left-hand portions of the electrodes. As a result of this asymmetry the holes and the electrons both move to the right when the clock voltages $\phi_1$ and $\phi_2$ are applied.

Figure 19:
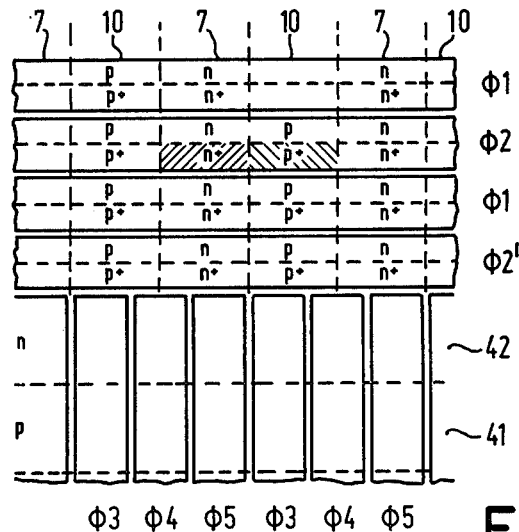
FIG. 19 is a diagrammatic plan view of a further embodiment of a CTD sensor in accordance with the invention.

FIG. 19 is a diagrammatic plan view of a part of an embodiment of a 2-phase modification of the CCD sensor shown in FIG. 8. FIG. 19 shows a part of the memory section B and the adjoining part of the read-out registers 41, 42, in which only three n-channel registers 7 and three p-channel registers 10 are shown of the memory section B.

In contrast with the embodiment shown in FIG. 8, the registers 7, 10 are formed by 2-phase CCD's with clock electrodes $\phi_1$ and $\phi_2$. The asymmetry required is obtained by carrying out extra implantations below the electrodes in such manner that when suitable clock voltages are applied a potential well is formed below the lower half of each electrode and a potential barrier for the charge carriers in question is formed below the upper half. In the Figure the line of separation between the halves is shown in broken lines. For that purpose, in the present embodiment, an extra n-implantation, denoted by n+, is carried out below the lower half of each electrode in the n-channel registers 7, and an extra p-doping, denoted diagrammatically by p+, is carried out in the p-channel registers. Of course these implantations may also be provided in the pick-up section A.

The series registers 41, 42 may be carried out in the same manner as 2-phase registers. However, this is not necessary. These registers may also be constructed as 4-phase registers in the same manner as in the FIG. 8 embodiment. In the embodiment described, however, the read-out registers 41, 42 are formed by 3-phase CCD's in which each cell comprises three electrodes $\phi_1$, $\phi_2$ and $\phi_3$.

Figure 20:
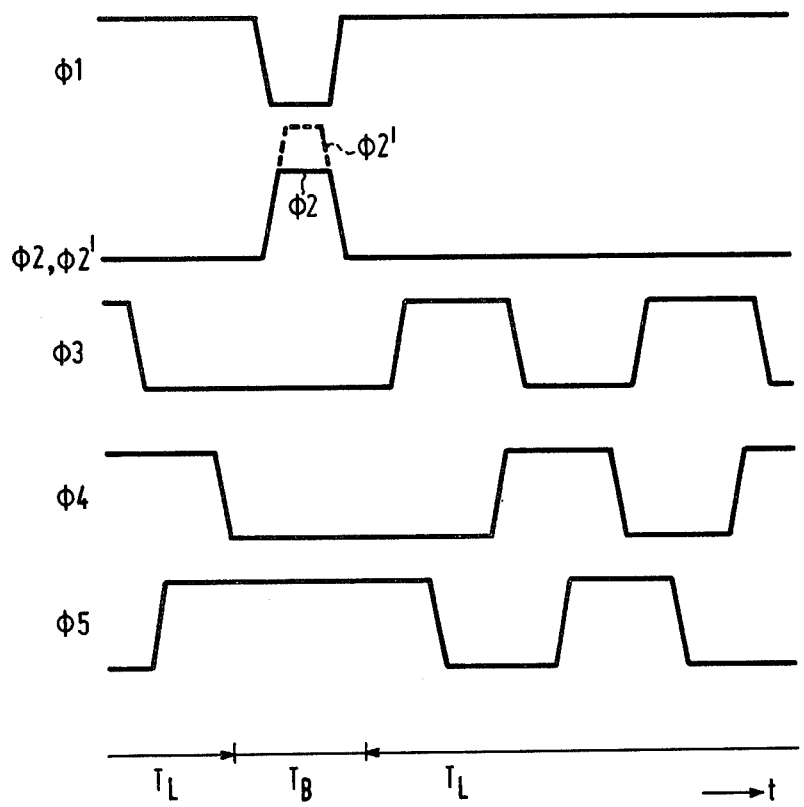
FIG. 20 shows a diagram of clock voltages which are applied to said device.

The transfer from the memory section to the series registers 41, 42 takes place by means of the clock electrode $\phi_2'$ which is clocked in phase with the electrodes $\phi_2$ but in which the amplitude of the clock voltage differs. FIG. 20 shows the various clock voltages as a function of the time t. In the line time $T_L$ each time a line is read by means of the clocks $\phi_3$, $\phi_4$ and $\phi_5$. These voltages produce the transport of holes and electrons from the left to the right. In the time interval $T_b$, $\phi_1$ and $\phi_2$ are clocked so that the whole pattern of holes and electrons in the registers 7 and 10 moves one place downwards. The holes which are stored below $\phi_2'$, for example, may be transferred by the extra positive pulse on $\phi_2'$ to the register 41 below the register 42 and be stored in the register 41 below the electrode $\phi_3$, $\phi_4$. During the positive voltage pulse $\phi_2'$, electrons are transferred from below the adjacent $\phi_1$ electrode to $\phi_2'$, and, when $\phi_2'$ again goes to the low voltage level, be transferred to the register 42 below the electrodes $\phi_5$.

Figure 21:
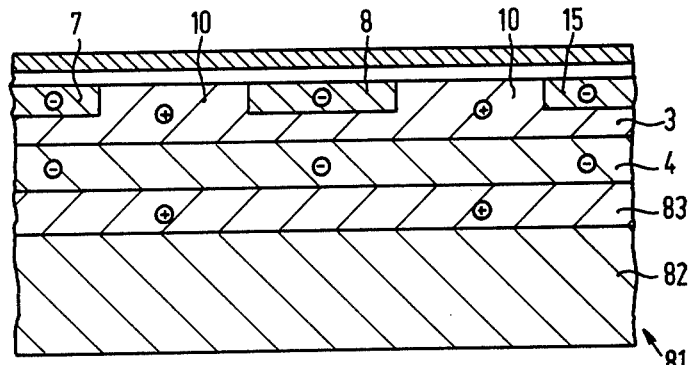
FIG. 21 is a sectional view (transverse to the charge transport direction) of a further embodiment of a CCD in accordance with the invention.

In the embodiments described thus far the p-type surface layer 3 is provided on an n-type region 4 which is formed by a substrate or starting body. However, it is also possible to provide the n-type region 4 in the form of a thin layer which itself may be used again for the formation of transport channels. FIG. 21 is a cross-sectional view (transverse to the charge transport direction) of such an embodiment. This drawing shows a few n-type registers 7, 8, 15 and p-type registers 10. The electron and hole packets are denoted by — and +, respectively. The p-type layer 3 is provided on a thin n-type layer 4 over the whole thickness of which a depletion region may be formed for bulk charge transport. The potential profile which is formed by applying voltages in the p-type layer 3 and the n-type zones provided therein, continues in principle into the n-type layer 4. As a result of this, potential minima (for electrons) are formed in the n-type layer 4 below the n-channels 7, 8 and 15 and potential barriers are formed below the p-type channels 10. Electrons which, for example, are generated by absorption of light in and/or near the layer 4 can be stored and transported in the potential minima. If desired, as shown in FIG. 21, a thin p-type layer 83 may be provided below the n-type layer 4 and be bounded on the lower side by the n-type substrate 82. By a suitable choice of thickness and doping concentration a depletion region may be formed also in the layer 83 throughout its thickness, the said potential profile of the layer 3 continuing into the layer 83 and, for holes, forming potential minima below the p-channels 10 and potential barriers below the n-type regions 7, 8 and 15. Holes which are generated in the layer 83 may as a result of this be stored in the potential minima in the form of packets which are separated from each other by the barriers.

Figure 22:
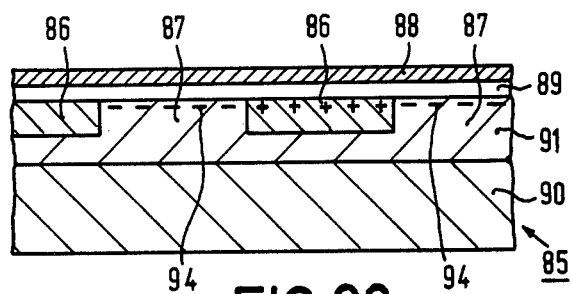
FIG. 22 is a sectional view of still a further embodiment of a CCD in accordance with the invention.

FIG. 22 is a sectional view (transverse to the charge transport direction) of an embodiment of a charge coupled device in accordance with a second aspect of the invention. The device comprises a semiconductor body 85 in which a number of CCD channels are defined, of which FIG. 22 shows only four, namely two channels 86 and two channels 87. These channels are situated beside each other and extend parallel (perpendicularly to the plane of the drawing) in the semiconductor body and comprise a common set of clock electrodes of which only one is shown in the drawing, namely electrode 88. The electrode 88 is insulated from the body 85 by an insulating layer 89, for example of silicon oxide. In the present embodiment the semiconductor body 85 may again be constructed from an n-type silicon substrate 90 having a p-type surface layer 91, but it will be apparent that the conductivity types may also be reversed.

The channels 86, 87 which, as in the preceding embodiment, adjoin each other, do not have opposite dopings in this embodiment but they are both doped with dopants causing the same conductivity type, that is to say the p-type. The doping concentration of the channels 86, however, has been made higher, for example, by means of ion implantation, than that of the channels 87, as a result of which the potential profile at the area of the channels 86 differs from that at the area of the channels 87.

Figure 23:
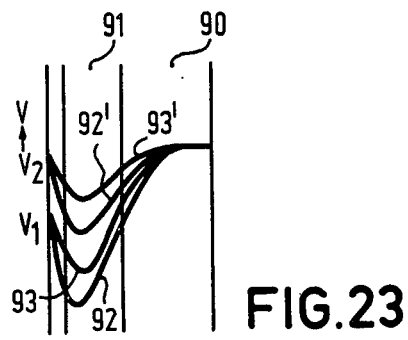
FIG. 23 shows diagrammatically potential profiles occurring in the device shown in FIG. 22.

FIG. 23 shows the potential profile V in the semiconductor body at different applied voltages. Such voltages are applied to the layer 91, the substrate 90 and the clock electrodes 88 that a depletion layer is formed in the layer 91 throughout its thickness. At the area of the channels 86 the potential profiles 92 and 92' are formed at electrode voltages $V_1$ and $V_2$, respectively, ($V_2$ being higher than $V_1$). At the area of the channels 86 potential profiles are formed, namely in the interior (bulk) of the p-type layer 91. Holes can be stored in these potential pits and be transported by displacing the potential minima. In this manner a number of p-type channels with bulk transport in the semiconductor layer 91 is defined. At the area of the regions 87 potential profiles 93 and 93' are formed, the minima of which are higher than those of the potential profiles 92, 92'. The profiles 93, 93' therefore form lateral potential barriers for the channels 86 and insulate these from each other.

Potential minima are formed for electrons at the area of the regions 87 at the surface. These minima are bounded laterally by the surface potentials at the area of the regions 86. This means that the regions 87 may be used simultaneously as surface channels of the n-type which adjoin the channels 86 and are insulated from each other by these. FIG. 22 shows diagrammatically a few electron packets 94.

The holes in the regions 86 and the electrons in the regions 87 can be transported, for example, in a manner described with reference to the preceding embodiments, by means of known clock voltage systems.

Figure 24:
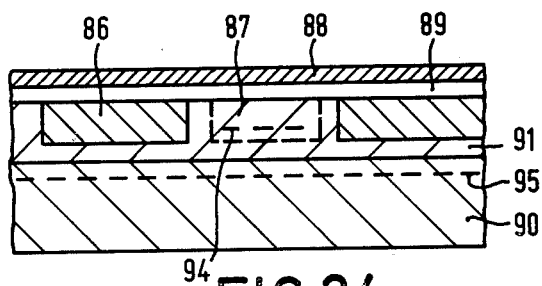
FIG. 24 shows a modified embodiment of a CCD in accordance with the invention.

In the FIG. 22 embodiment, the channel 86 is of the bccd type and the channel 87 is of the surface type. FIG. 24 is a sectional view of a modified embodiment in which both channels are of the bccd or pccd type. Instead of a p-type layer, an n-type layer 91 is used on the substrate 90 and forms p-n junctions with the p-type regions 86. By suitably choosing the dopings in the various regions, a depletion region 95 denoted by broken lines can be formed around the p-type regions 86, by cutting off the p-n junctions, which region entirely encloses the region 87 and insulates it from the substrate 90. By removing all electrons, the region 87 may now be used as a channel of a bulk channel CCD register.

It will be apparent that the invention is not restricted to the embodiments described, but that many variations are possible to those skilled in the art without departing from the scope of the invention.

For example, the conductivity types in the embodiments described with the polarity of the associated applied voltages may be reversed. In an embodiment with bulk channel (pccd or bccd), electrodes may also be used which are not separated from the transport channels by an insulating oxide layer but by a rectifying junction. So in this case the electrode may be provided in the form of metal layers which form a Schottky junction with the transport channels. The electrodes may also be formed by diffused zones which form p-n junctions with the transport channels.

In the SPS memory described with reference to FIG. 14 and the following Figures, the known principle of "multiphase clocking" may be used both for the hole transport and for the electron transport. In this mode of operation an empty "bucket" always occurs beside a number of filled "buckets" arranged behind each other, the empty bucket being always moved over one place. This principle, by which an important increase of the information density can be obtained when used in devices with complementary CCD's, will generally involve shifting in juxtaposed cells the empty bucket in the p-type channels with respect to the empty bucket in the n-type channels.

In the SPS structure described, four electrodes occur in the series registers per two parallel channels. However, it is also possible to form four parallel channels per four electrodes in the series registers so that a further increase in density can be obtained.

In the embodiments which relate to image sensors, the known system of "interlining" may be used in which in two successive frame times the charge packets below various clock electrodes are corrected so that it appears as if the pick-up elements are moved half a place with respect to each other.

What is claimed is:

1. A charge-coupled device of the bulk-channel type having a semiconductor body comprising a surface-adjoining surface layer of the first conductivity type in which a number of mutually similar surface zones of the second conductivity type are provided which extend parallel to each other in the surface layer and, together with the intermediate, surface-adjoining parts of the surface layer, define a group of parallel and juxtaposed CCD-lines of alternately the first and the second conductivity type, characerterized in that the outputs of said CCD-lines of the first and the second conductivity types, respectively, are connected to parallel inputs of a series register of the first conductivity type and to the parallel inputs of a series register of the second conductivity type, respectively, said series registers being formed by CCD-lines of the bulk-channel type, the series register of the second conductivity type being defined by a further surface zone of the second conductivity type which is provided in the surface layer and which is present between the group of parallel CCD-lines, the series register of the first conductivity type being defined by a part of the surface layer which is present beside the series register of the second type, and means being provided for forming underpasses below the series register of the second conductivity type via which charge packets can be transferred from the group of parallel CCD-lines of the first conductivity type to the series register of the first conductivity type.

2. A charge coupled device as claimed in claim 1, characterized in that the width of the surface zones of the second conductivity type, in a direction transverse to the charge transport direction, is at least substantially as large as the width of said intermediate part of the surface layer.

3. A charge coupled device as claimed in claim 1 or 2, characterized in that the CCD lines of the first and the second conductivity types, respectively, comprise inputs which are connected to parallel inputs of series registers of the first and the second conductivity types, respectively, formed by CCD lines defined in the surface layer, the charge transport direction of which is transverse to the charge transport direction of the CCD lines belonging to said group.

4. A charge coupled device as claimed in claim 3, characterized in that both the inputs and the outputs of CCD lines belonging to the said group are connected to series registers so that a series-parallel-series memory matrix is formed of which said group of parallel CCD lines forms the parallel section.

5. A charge coupled device as claimed in claim 1 or 2, characterized in that said group of parallel CCD lines forms a matrix of photosensitive elements of a solid state image sensor.

6. A charge-coupled device as claimed in claim 5, characterized in that the sensor is of the "frame transfer" type in which the group of parallel CCD-lines, in the longitudinal direction of the lines, is divided into two substantially identical parts, one of which precedes the other and forms the said matrix of photosensitive elements, while the other part forms a memory matrix for storing the electric charge generated in the photosensitive matrix.

7. A charge coupled device as claimed in claim 6, characterized in that the dimensions and doping concentrations in at least the part of the sensor which forms the matrix of photosensitive elements are so chosen that in the case of local overexposure, charge carriers of one type spread in a direction parallel to the charge transport direction and charge carriers of the opposite type spread in a direction transverse thereto.

8. A charge-coupled device as claimed in claim 1 or 2, characterized in that the surface layer is of the p-conductivity type and the surface zones formed therein are of the n-conductivity type.

9. A charge-coupled device as claimed in claim 1, characterized in that the semiconductor body comprises a number of ajoining semiconductor layers of mutually opposite conductivity types having a thickness and doping concentration such that the potential profile in said channels defined in the top layer continues into the underlying semiconductor layers so that a number of further channels for at least one of storage and transport; of charge carriers are defined in said semiconductor layers.

* * * * *